United States Patent [19]

Wakimoto

[11] Patent Number: 4,543,494

[45] Date of Patent: Sep. 24, 1985

[54] MOS TYPE OUTPUT DRIVER CIRCUIT HAVING A PROTECTIVE CIRCUIT

[75] Inventor: Yasuhiro Wakimoto, Yokohama, Japan

[73] Assignee: Fujitsu Limited, Kawasaki, Japan

[21] Appl. No.: 454,167

[22] Filed: Dec. 28, 1982

[30] Foreign Application Priority Data

Dec. 29, 1981 [JP] Japan .................. 56-213408

[51] Int. Cl.$^4$ .................. H03K 17/08; H03K 17/687
[52] U.S. Cl. .................. 307/200 B; 307/443;
307/448; 307/362; 307/548; 307/577; 307/264;
361/91; 361/88; 361/86
[58] Field of Search .............. 307/130, 200 A, 200 B,
307/443, 448, 354, 362, 363, 548, 550, 572, 577,
584, 264, 270, 594; 323/276–277

[56] References Cited

U.S. PATENT DOCUMENTS

| | | | |
|---|---|---|---|
| 3,749,936 | 7/1973 | Bell | 307/202 |
| 3,906,255 | 9/1975 | Mensch, Jr. | 307/448 |
| 3,912,981 | 10/1975 | Tsurushima | 307/200 B X |
| 3,938,008 | 10/1976 | Knepper et al. | 317/31 |
| 3,988,695 | 10/1976 | Mattfeld et al. | 307/200 A X |
| 4,275,313 | 6/1981 | Boll et al. | 307/448 |
| 4,305,106 | 12/1981 | Bergman | 307/200 A X |
| 4,329,600 | 5/1982 | Stewart | 307/540 |
| 4,338,646 | 7/1982 | Davis et al. | 323/276 X |
| 4,347,447 | 8/1982 | Proebsting | 307/448 X |
| 4,363,068 | 12/1982 | Burns | 307/200 B X |

FOREIGN PATENT DOCUMENTS 2005935 4/1979 United Kingdom .

OTHER PUBLICATIONS

"Patent Abstracts Japan", May 24, 1980, vol. 4, No. 71, p. 125 E 12.

Primary Examiner—Stanley D. Miller
Assistant Examiner—D. R. Hudspeth
Attorney, Agent, or Firm—Staas & Halsey

[57] ABSTRACT

A MOS type output driver circuit including an output circuit having first and second MOS type output transistors connected between a voltage supply and ground. The gates of the first and second output transistors are respectively, supplied with first and second drive signals that are mutually inverted. The MOS type output driver circuit further includes a protective circuit for preventing the output transistors from being damaged by overcurrent when the output is shorted to ground.

3 Claims, 12 Drawing Figures

4,543,494

MOS TYPE OUTPUT DRIVER CIRCUIT HAVING A PROTECTIVE CIRCUIT

BACKGROUND OF THE INVENTION (1) Field of the Invention

The present invention relates to a metal oxide semiconductor (MOS) type output driver circuit, more particularly, to a protective circuit for an output transistor of the output driver circuit during short-circuits.

(2) Description of the Prior Art

N-channel MOS type output driver circuits have recently come into wide use for output driver circuits in address buses and data buses of microcomputers and the like. N-channel MOS type output driver circuits are usually used in bidirectional buses. Therefore, if one output driver circuit erroneously outputs an "H" level when another output driver connected to the same bus line outputs on "L" level, the output transistors of the output driver circuits would be destroyed by overcurrent. This makes it necessary for the output driver circuits to be replaced every time such troubles occur.

Further, quasi-birdirectional bus sytems recently have come into general use as address buses and data buses of microcomputer systems. In quasi-bidirectional bus systems, the output driver circuits connected to the bus line are not controlled in the high impedance state, unlike ordinary bidirectional bus systems. When one of the output driver circuits connected to the same bus line outputs an "L", level the outputs of the other output drivers, which is set an "H", level must be pulled down to the "L" level without damage.

SUMMARY OF THE INVENTION

An object of the present invention is to provide a MOS type output driver circuit which has a protective circuit for the output transistor, capable of preventing damage to the output transistor even when the output of the driver circuit is shorted to ground when an "H" level is output.

Another object of the present invention is to provide a MOS type output driver circuit which can be used in a quasi-bidirectional bus system.

In accordance with the present invention, there is provided a MOS type output driver circuit including voltage supplying means, ground potential supplying means, output means having a first output transistor having a gate for receiving a first drive signal, and a second output transistor having a gate for receiving a second drive signal. The first and second output transistors are connected in series between the voltage supplying means and the ground potential supplying means. The first and second drive signals are complementary to each other, a connection point between the first and second output transistors is led out as an output of the output driver circuit, and a detector means is connected to the connection point for detecting whether an output level of the output means is lower than a reference voltage when the first output transistor is conductive. A control means is connected to the gate of the first output transistor and forces the gate level of the first output transistor to be low in response to an output of the detector means so as to turn the first output transistor off. An inhibit means is connected to the detector means, for inhibiting the output of the detector means for a predetermined period after the second output transistor turns from a conductive state to a nonconductive state.

DESCRIPTION OF THE PREFERRED EMBODIMENT

A MOS type driver circuit according to the present invention will now be described in detail with reference to the prior art and a preferred embodiment.

Figure 1:
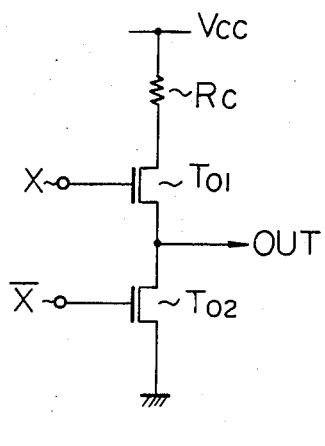
FIG. 1 is a circuit diagram of a prior art output driver circuit.

A prior art MOS type output driver circuit is illustrated in FIG. 1. The MOS type output driver circuit of FIG. 1 comprises first and second N-channel MOS type output transistors $T_{01}$ and $T_{02}$ and a current limiting resistor $R_C$. One end of the resistor $R_C$ is connected to the voltage supply $V_{cc}$, and the other end is connected to the drain of the first output transistor $T_{01}$. The source of the first output transistor $T_{01}$ is connected to the drain of the second output transistor $T_{02}$, and the source of the second output transistor $T_{02}$ is connected to ground. A first drive signal X is supplied to the gate of the first output transistor $T_{01}$, and a second drive signal $\overline{X}$ (the signal X inverted) is supplied to the gate of the second output transistor $T_{02}$. The output signal is led out from the connection point between the first and second output transistors $T_{01}$ and $T_{02}$.

On the output driver circuit of FIG. 1, when the drive signal X is an "L" level and $\overline{X}$ is an "H" level, the first output transistor $T_{01}$ turns off and the second output transistor $T_{02}$ turns on. Accordingly, the output signal OUT becomes the "L" level. On the other hand, when X is the "H" level and $\overline{X}$ is the "L" level, the first output transistor $T_{01}$ turns on and the second output transistor $T_{02}$ turns off. Accordingly, the output signal OUT becomes the "H" level.

In the output driver circuit of FIG. 1, even if the output OUT is shorted to ground when the "H" level is output, the current flowing from the first output transistor $T_{01}$ is limited by the resistor $R_C$. Therefore, the first output transistor $T_{01}$ can be prevented from being damaged by overcurrent. However, the current drive ability of the output driver circuit of FIG. 1 is decreased by the resistor $R_C$. This is quite disadvantageous for an output driver circuit.

Figure 2:
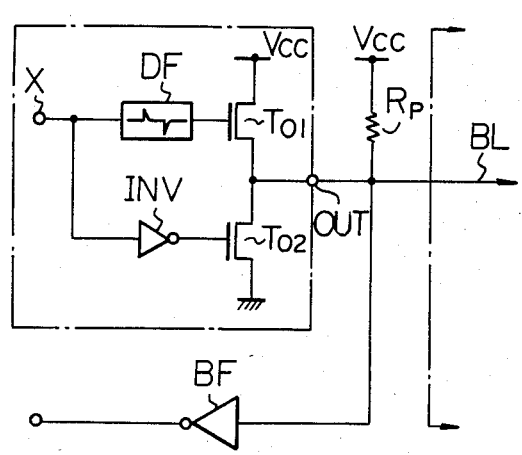
FIG. 2 is a circuit diagram of another prior art output driver circuit.

Another prior art output driver circuit is illustrated in FIG. 2. The output driver circuit of FIG. 2 comprises first and second N-channel MOS type output transistors $T_{01}$ and $T_{02}$, a differentiation circuit DF, and an inverter circuit INV. The first and second output transistors $T_{O1}$ and $T_{O2}$ are connected in series between voltage supply $V_{cc}$ and the ground. A drive signal X is supplied to the inputs of the differentiation circuit DF and the inverter circuit INV. The output of the differentiation circuit DF is supplied to the gate of the first output transistor $T_{O1}$, and the output of the inverter circuit INV is supplied to the gate of the second output transistor $T_{O2}$. The output signal OUT of the output driver circuit is led out from the connection point between the first and second output transistors $T_{O1}$ and $T_{O2}$. The output driver circuit of FIG. 2 is mostly used in a quasi-bidirectional bus system as shown in FIG. 2. The output of the output driver circuit is connected to a bus line BL. The input of a buffer circuit BF is also connected to the bus line BL. The bus line BL is connected through a pull-up resistor $R_P$ to the voltage supply $V_{cc}$. In the output driver circuit of FIG. 2, when the drive signal X is the "L" level, the output of the inverter circuit INV is the "H" level. Thus, the second output transistor $T_{O2}$ is on, the second output transistor $T_{O1}$ is off, and the output level becomes the "L" level. When the drive signal X is changed from the "L" level to the "H"L level, the output of the inverter circuit INV becomes the "L" level and the output transistor $T_{O2}$ turns off. On the other hand, the output of the differentiation circuit DF becomes the "H" level in response to the rising end of the drive signal X, and the first output transistor $T_{O1}$ is on only for a short period of time. Thus, the level of the bus line BL is pulled up to the "H" level by the current flowing through the first output transistor $T_{O1}$ while it is on. After the short period of time, the output of the differentiation circuit DF becomes the "L" level, and the first output transistor $T_{O1}$ turns off, thus the level of the bus line BL is kept at the "H" level only by the pull-up resistor $R_P$. Accordingly, even if the bus line BL is shorted to ground when the drive signal X is the "H" level, the first output transistor $T_{O1}$ is not damaged. Thus, the output driver circuit of FIG. 2 can be used in the quasi-bidirectional bus system. However, the output driver circuit of FIG. 2 is not suitable for use in a usual bidirectional bus system.

Figure 3:
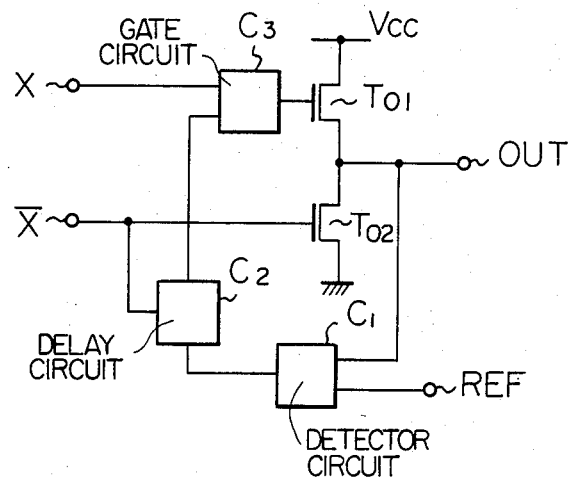
FIG. 3 is a basic circuit diagram of a MOS type output driver circuit according to the present invention.

The basic circuit of a MOS type output driver circuit according to the present invention is illustrated in FIG. 3. The output driver circuit of FIG. 3 comprises an output circuit having first and second N-channel MOS type transistors $T_{O1}$ and $T_{O2}$ connected in series between the voltage supply $V_{cc}$ and ground, a detector circuit $C_1$, a delay circuit $C_2$, and a gate circuit $C_3$. A drive signal X is supplied to the gate of the first output transistor $T_{O1}$ through the gate circuit $C_3$, and another drive signal $\overline{X}$ (the drive signal x inverted) is supplied to the gate of the second output transistor $T_{O2}$. The output signal OUT is led out from the connection point between the first and second output transistors $T_{O1}$ and $T_{O2}$.

In the output driver circuit of FIG. 3, the level of the output signal OUT is compared with a reference voltage REF in the detector circuit $C_1$ to detect whether the output OUT is lower than the reference voltage REF. The output signal of the detector circuit $C_1$ is supplied to the delay circuit $C_2$. The delay circuit $C_2$ is also supplied with the drive signal $\overline{X}$. When the drive signal $\overline{X}$ is the "H" level, that is the, the drive signal X is "L" level, the delay circuit $C_2$ does not operate, and the gate circuit $C_3$ does not inhibit the drive signal X from being supplied to the gate of the first output transistor $T_{O1}$. When the drive signal $\overline{X}$ changes from the "H" level to the "L" level and the drive signal X changes from the "L" level to the "H" level, the delay circuit $C_2$ starts to operate after a delay time $T_o$ from the change of the drive signal $\overline{X}$. Thus, the drive signal X is supplied to the gate of the first output transistor $T_{O1}$ through the gate circuit $C_3$, the first output transistor $T_{O1}$ turns from off to on, and the second output transistor $T_{O2}$ turns from on to off. Accordingly, the level of the output OUT is increased to the "H" level. However, if output OUT is shorted to the ground, the level of the output OUT is not increased higher than the reference voltage REF during the delay time $T_D$ and the delay circuit $C_2$ outputs a signal to the gate circuit $C_3$ for inhibiting the "H" level signal from being supplied to the gate of the first output transistor $T_{O1}$. The first output transistor $T_{O1}$ is then turned off and prevented from being damaged by overcurrent.

Assume that the "H" level signal is normally output in the output driver circuit of FIG. 3. Under this condition, if the output OUT is shorted to ground, then the level of the output OUT falls lower than the reference voltage REF, the detector circuit $C_1$ supplies a signal through the delay circuit $C_2$ to the gate circuit $C_3$, and the first output transistor $T_{O1}$ is turned off, thus preventing the first output transistor $T_{O1}$ from being damaged by overcurrent.

Figure 4:
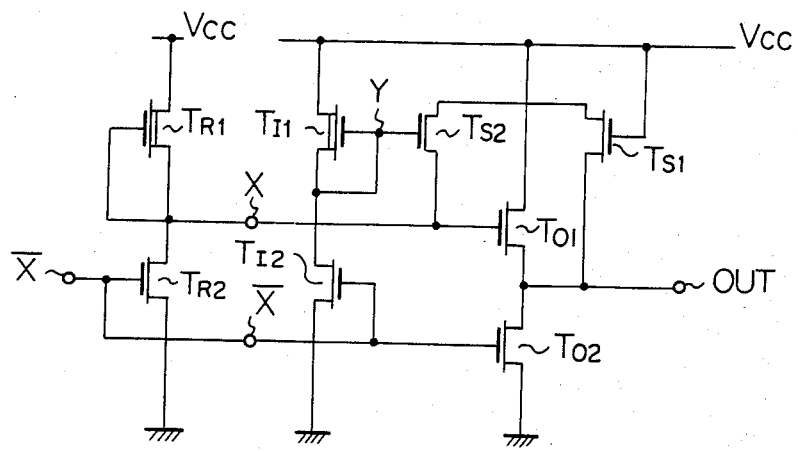
FIG. 4 is a circuit diagram of a MOS type output driver circuit in accordance with one embodiment of the present invention.

An output driver circuit in accordance with one embodiment of the present invention is illustrated in FIG. 4. The output driver circuit of FIG. 4 comprises an output circuit, having first and second N-channel MOS type output transistors $T_{O1}$ and $T_{O2}$, and a protective circuit having N-channel MOS type transistors $T_{S1}$, $T_{S2}$, $T_{I1}$ and $T_{I2}$. The first and second output transistors $T_{O1}$ and $T_{O2}$ are connected in series between the voltage supply $V_{cc}$ and ground. A first drive signal X is supplied to the gate of the first output transistor $T_{O1}$, and a second drive signal $\overline{X}$ is supplied to the gate of the second output transistor $T_{O2}$. The connection point between the first and second output transistors $T_{O1}$ and $T_{O2}$ is also connected to the output OUT.

In the protective circuit, the source of the transistor $T_{S1}$ is connected to the output OUT of the output circuit, and the gate of the transistor $T_{S1}$ is connected to the voltage supply $V_{cc}$. The drain of the transistor $T_{S1}$ is connected to the source of the transistor $T_{S2}$, and the gate of the transistor $T_{S2}$ is connected to the gate and source of the transistor $T_{I1}$, which is a depletion type transistor. The drain of the transistor $T_{S2}$ is connected to receive the first drive signal X. The drain of the transistor $T_{I1}$ is connected to receive the voltage supply $V_{cc}$, and the source of the transistor $T_{I1}$ is connected to the drain of the transistor $T_{I2}$. The gate of the transistor $T_{I2}$ is connected to receive the second drive signal $\overline{X}$, and the source of the transistor $T_{I2}$ is connected to ground. The first drive signal X may be output by an inverter circuit as shown in FIG. 4. The inverter circuit has N-channel MOS type transistors $T_{R1}$ and $T_{R2}$ connected in series between the voltage supply $V_{cc}$ and ground.

Figure 6:
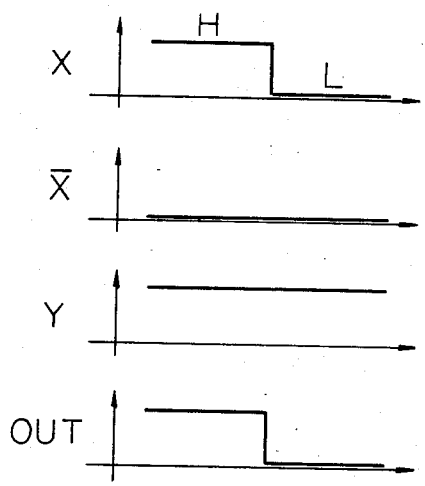
FIG. 6 is a diagram of waveforms of the protective operation shown in FIGS. 5A, 5B, and 5C, FIGS. 7A, 7B and 7C are operational diagrams of the protective operation of the circuit of FIG. 3 when an "H" level is output when the output terminal is shorted to ground.
Figure 5A:
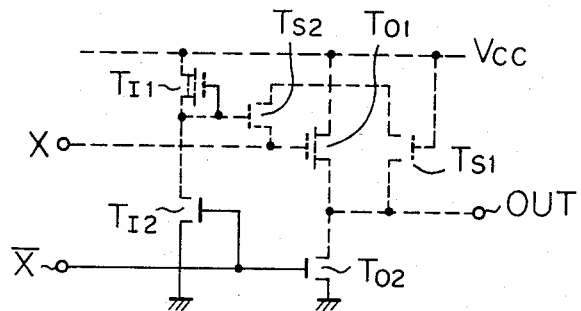
FIGS. 5A, 5B, and 5c are operational diagrams of the protective operation of the circuit of FIG. 3 when the output short-circuits when the "H" level is output.
Figure 5B:
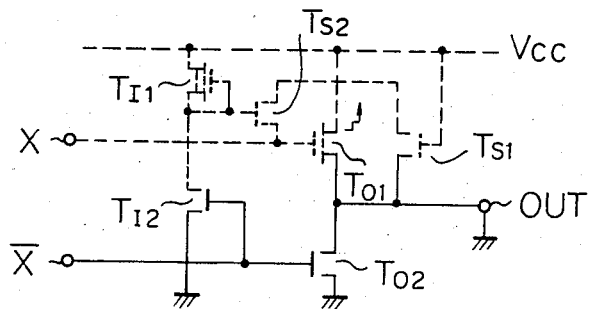
Figure 5C:
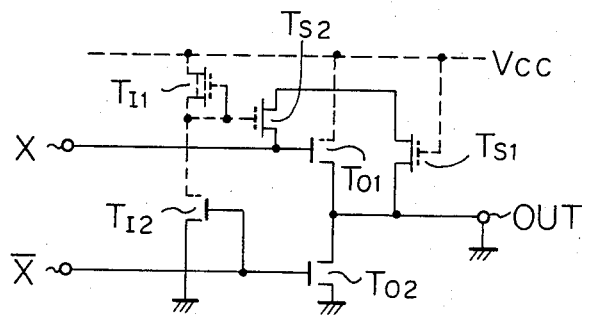

The operation of the protective circuit in the output driver circuit of FIG. 4 in the case where the output OUT is shorted to ground while the level of the output OUT is "H", is illustrated in FIGS. 5A, 5B, and 5C. In these drawings, the broken lines indicate the signal lines of the "H" level, and the continuous lines indicate the signal lines of the "L" level. FIG. 6 illustrates waveforms of various signals in the output driver circuit of FIG. 4 in the above-mentioned case.

First, FIG. 5A illustrates the condition of the output driver circuit in the case where the first drive signal X is the "H" level and the second drive signal $\bar{X}$ is the "L" level, thus the output OUT is the "L" level. Under this condition, the first output transistor $T_{01}$ is on, the second output transistor $T_{02}$ is off, and the transistor $T_{I2}$ is off. Thus, the level Y of the gate of the transistor $T_{S2}$ is the "H" level, as shown in FIG. 6. FIG. 5B illustrates the condition immediately after the output OUT is shorted to ground under the above-mentioned condition. In the condition of FIG. 5B, the level of the output OUT falls to "L" as shown in FIG. 6 and an overcurrent flows through the first output transistor $T_{01}$ momentarily. FIG. 5C illustrates the condition when the protective circuit has operated. In FIG. 5C, since the level of the output OUT falls to "L", the voltage difference between the gate and source of the transistor $T_{S1}$ exceeds the threshold value $V_{th}$, the transistor $T_{S1}$ becomes on, and the transistor $T_{S2}$ becomes off.

Figure 8:
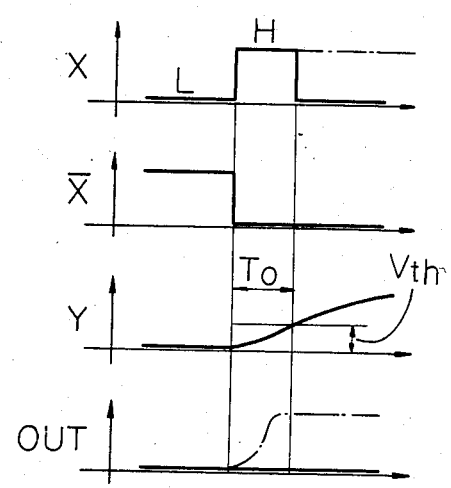
FIG. 8 is a diagram of waveforms of the protective operation shown in FIGS. 7A, 7B and 7C.
Figure 7A:
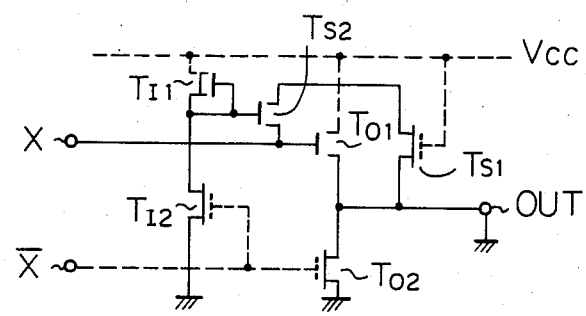
Figure 7B:
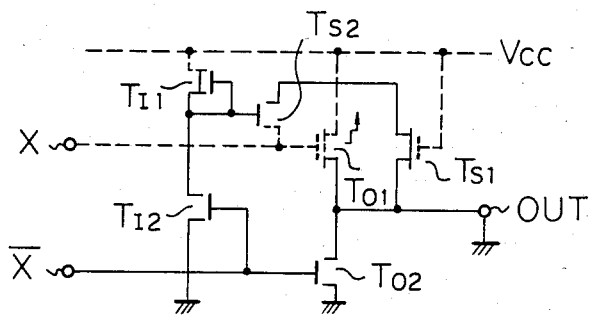
Figure 7C:
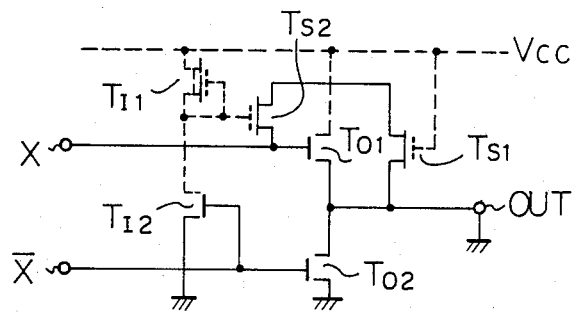

The operation of the protective circuit in the output driver circuit of FIG. 4 when the output driver outputs the "H" level when the output OUT is shorted to ground, is illustrated in FIGS. 7A, 7B, and 7C. In these drawings, the broken lines indicate the signal lines of the "H" level, and the continuous lines indicate the signal lines of the "L" level, the same as in FIGS. 5A, 5B, and 5C. FIG. 8 illustrates various waveforms in the output driver circuit of FIG. 4 in the above-mentioned condition.

First, FIG. 7A illustrates the condition of the output driver circuit in the case where the first drive signal X is the "L" level, the second drive signal $\bar{X}$ is the "H" level, and the output OUT is shorted to ground. In this condition, the transistor $T_{I2}$ is on, and the level Y of the gate of the transistor $T_{S2}$ is the "L" level. FIG. 7B illustrates the condition immediately after the first drive signal X is changed from the "L" level to the "H" level under the second drive signal $\bar{X}$ is changed from the "H" level to the "L" level under the condition of FIG. 7A. In this condition, the first output transistor $T_{01}$ turns from off to on and the second output transistor $T_{02}$ turns from on to off. The transistor $T_{I2}$ also turns from on to off, and the level Y of the gate of the transistor $T_{S2}$ starts to increase by charging the gate capacitor through the on-state resistor of the depletion type transistor $T_{I1}$ as shown in FIG. 8. Since output OUT is shorted to the ground, the transistor $T_{S1}$ is on, but the transistor $T_{S2}$ is kept off until the gate level Y of the transistor $T_{S2}$ becomes higher than the threshold value $V_{th}$. FIG. 7C illustrates the condition where the protective circuit becomes operative. When the gate level Y of the transistor $T_{S2}$ becomes higher than $V_{th}$ after a delay time $T_D$, for example 10 to 20 nanoseconds, the transistor $T_{S2}$ becomes on, the first drive signal X becomes the "L" level as shown in FIG. 8, and the first output transistor $T_{01}$ is turned off.

As described above, the protective circuit of the output driver circuit of FIG. 4 does not operate during the delay time $T_0$ after the output is changed to the "H" level. Accordingly, if the output OUT becomes the "H" level during the delay time $T_D$, the protective circuit does not work, and the output driver circuit of FIG. 4 can output an "H" level signal normally, as shown by one dotted lines in FIG. 8.

The output driver circuit of FIG. 4 has the following advantages:

(1) No necessity of timing signals because of its being asynchronous;

(2) Capability of operation even with abnormal capacitive loads, (3) Automatically resetting upon removal of the cause of trouble;

(4) Simple circuit construction;

(5) Ability to be used in quasi-bidirectional bus system without conventional protective functions or timing signals; and (6) Safety characteristics with regard to temperature increases.

In the above described embodiment, an N-channel MOS type output driver circuit is described. The present invention, however, can be applied to a P-channel MOS type output driver circuit as well.

According to the present invention, there is provided a MOS type output driver circuit which is protected from damage by overcurrent when the output to short-circuits.

I claim:

1. A MOS type output driver circuit operativey connected to receive first and second driver signals, comprising:

voltage supplying means for supplying a reference voltage;

ground potential supplying means;

output means having an output terminal, for producing an output level, comprising:

a first output transistor, having a drain operatively connected to said voltage supplying means, having a gate for receiving the first drive signal, and having a source;

a second output transistor, having a drain operatively connected to said source of said first output transistor, having a source operatively connected to said ground potential supplying means, and having a gate for receiving the second drive signal, the first and second drive signals being complementary to each other, the connection of said source of said first output transistor and said drain of said second output transistor forming a connection point which is said output terminal of said output means;

detector means, operatively connected to said connection point and said voltage supplying means, for detecting whether the output level of said output means is lower than the reference voltage when said first output transistor is conductive and, accordingly, outputting an output signal;

control means, operatively connected to said gate of said first output transistor and said detector means, for forcing the gate level of said first output transistor to be low in response to the output signal of said detector means so as to turn said first output transistor off; and delay inhibit means, operatively connected to said detector means and said second output transistor, for inhibiting the output signal of said detector means for a predetermined period after said second output transistor changes from a conductive state to a non-conductive state.

2. A MOS type output driver circuit according to claim 1, wherein:

said detector means comprises a detector transistor having a source operatively connected to said connection point, a gate operatively connected to said voltage supplying means, and a drain;

said control means comprises a control transistor having a source operatively connected to said drain of said detector transistor, having a drain operatively connected to said gate of said first output transistor, and having a gate; and said delay inhibit means comprises first and second transistors having their drain-source current paths operatively connected in series between said voltage supplying means and said ground potential supplying means, said first transistor being a depletion type transistor and having a gate operatively connected to said gate of said control transistor, said second transistor having a gate operatively connected to said gate of said second output transistor, and having a drain operatively connected to said gate of said control transistor.

3. A MOS type output driver circuit operatively connected to a voltage supply and ground and operatively connected to receive first and second drive signals, the second drive signal being the complement of the first drive signal, comprising:

a first output transistor having conductive and non-conductive states, having a drain operatively connected to the voltage supply, having a gate for receiving the first drive signal, and having a source;

a second output transistor having conductive and non-conductive states, having a source operatively connected to ground, having a drain operatively connected to said source of said first output transistor at a connection point, and having a gate for receiving the second drive signal;

detector means, operatively connected to the voltage supply and said connection point, for generating a detection signal when an output level at the connection point is lower than the voltage supply when said first output transistor is in the conductive state;

control means, operatively connected to said gate of said first output transistor and said detector means, for forcing the level at said gate of said first output transistor to a low level in response to the detection signal of said detector means; and delay inhibit means, operatively connected to said detector means and said second output transistor, for inhibiting the detection signal of said detector means for a predetermined period after said second output transistor changes from the conductive state to the non-conductive state.

* * * * *

UNITED STATES PATENT AND TRADEMARK OFFICE
CERTIFICATE OF CORRECTION

PATENT NO. : 4,543,494
DATED : Sep. 24, 1985
INVENTOR(S) : WAKIMOTO

It is certified that error appears in the above-identified patent and that said Letters Patent is hereby corrected as shown below:

[57] ABSTRACT
Line 4, "are" s/b --are,--.

Col. 1
Line 31, ""L", level" s/b --"L" level,--;
Line 32, "an" s/b --to an--;
Line 32, ""H", level" s/b --"H" level,--;
Line 56, "other, a" s/b --other. A--;
Line 67, "means," s/b --means--;
Line 67, "inhibitting" s/b --inhibiting--.

Col. 2
Line 44, "signal" s/b --signal OUT--;
Line 45, delete "out".

Col. 3
Line 3, delete "the" (first occurrence);
Line 23, ""H"L" s/b --"H"--;
Line 64, "is the," s/b --is,--;
Line 65, "is" s/b --is the--.

UNITED STATES PATENT AND TRADEMARK OFFICE
CERTIFICATE OF CORRECTION

PATENT NO. : 4,543,494          Page 2 of 2

DATED : Sep. 24, 1985

INVENTOR(S) : WAKIMOTO

It is certified that error appears in the above-identified patent and that said Letters Patent is hereby corrected as shown below:

Col. 5
Line 64, "one" s/b --the--.

Signed and Sealed this

Twenty-first Day of January 1986

[SEAL]

Attest:

DONALD J. QUIGG

Attesting Officer      Commissioner of Patents and Trademarks